United States Patent [19]
Ameen et al.

[11] Patent Number: 5,591,034
[45] Date of Patent: *Jan. 7, 1997

[54] THERMALLY CONDUCTIVE ADHESIVE INTERFACE

[75] Inventors: Joseph G. Ameen; Joseph E. Korleski, both of Newark, Del.; William P. Mortimer, Jr., Conowingo, Md.; Victor P. Yokimcus, Landenberg, Pa.

[73] Assignee: W. L. Gore & Associates, Inc., Newark, Del.

[*] Notice: The term of this patent shall not extend beyond the expiration date of Pat. No. 5,545,473.

[21] Appl. No.: 506,700

[22] Filed: Jul. 25, 1995

Related U.S. Application Data

[63] Continuation-in-part of Ser. No. 296,220, Aug. 25, 1994, abandoned, which is a continuation-in-part of Ser. No. 196,048, Feb. 14, 1994.

[51] Int. Cl.$^6$ ........................................................ H01R 4/00
[52] U.S. Cl. ........................ 439/91; 29/829; 428/283; 428/304.4; 428/306.6; 428/317.9; 428/323; 428/329; 428/421; 428/422; 428/901
[58] Field of Search ........................... 428/283, 304.4, 428/306.6, 317.9, 421, 422, 212, 323, 329, 901; 439/91; 29/829

[56] References Cited

U.S. PATENT DOCUMENTS

| | | | |
|---|---|---|---|
| 3,953,566 | 4/1976 | Gore | 264/288 |
| 4,008,300 | 2/1977 | Pomn | 264/104 |
| 4,265,775 | 5/1981 | Aakalu et al. | 252/573 |
| 4,385,093 | 5/1983 | Hubis | 428/316.6 |
| 4,518,737 | 5/1985 | Traut | 524/413 |
| 4,557,957 | 12/1985 | Manniso | 428/36 |
| 4,574,879 | 3/1986 | DeGree et al. | 165/185 |
| 4,598,011 | 7/1986 | Bowman | 428/221 |
| 4,602,678 | 7/1986 | Fick | 165/79 |

(List continued on next page.)

FOREIGN PATENT DOCUMENTS

| | | |
|---|---|---|
| 0322165 | 6/1989 | European Pat. Off. . |
| 54-156068 | 12/1979 | Japan . |
| 58-37541 | 8/1983 | Japan . |
| 61-40328 | 2/1986 | Japan . |
| 62-100539 | 5/1987 | Japan . |
| 62-52302 | 11/1987 | Japan . |
| 1012406 | 5/1989 | Japan . |
| 3137138 | 6/1991 | Japan . |
| 2219133 | 11/1989 | United Kingdom . |
| 2195269 | 1/1990 | United Kingdom . |

OTHER PUBLICATIONS

"Electronic Packaging & Production," Aug. 1993/55, No. 8, Newton, MA, p. 55.

"Thermally Conductive, Reworkable, Elastomeric Interposer for Chip–to–Heat Sink Attachment," IBM Technical Disclosure Bulletin, vol. 35, No. 7, Dec. 1992, p. 241.

"Effective Polymer Adhesives For Interconnect," N. P. Kreutter, B. K. Grove, P. B. Hogerton, C. R. Jensen, (date unknown).

"Unitek Equipment Technical Services Bulletin," Nuggets, 9202A.

Data Sheet–"Adhesives Interconnect Systems 5303R Z–Axis Adhesive Film (ZAF)," 3M Jan. 5, 1993, Rev. 002.

(List continued on next page.)

*Primary Examiner*—James J. Bell
*Attorney, Agent, or Firm*—Victor M. Genco, Jr.

[57] ABSTRACT

A thermally conductive interface is provided suitable for thermal conduction, especially between electronic components. The preferred thermally conductive interface comprises an open structure fluoropolymer material, such as expanded polytetrafluoroethylene, with uncoated thermally conductive particles attached to solid portions thereof. The interface has numerous benefits over previously available material, such as improved thermal conductivity, high conformability, better compressibility, inherent porosity so as to provide air relief, improved stress relief, and high material compliance and resistance to fatigue during thermal cycling.

18 Claims, 3 Drawing Sheets

U.S. PATENT DOCUMENTS

| | | | |
|---|---|---|---|
| 4,606,962 | 8/1986 | Reylek et al. | 428/148 |
| 4,669,954 | 6/1987 | Habarou et al. | 415/174 |
| 4,810,563 | 3/1989 | DeGree et al. | 428/209 |
| 4,820,376 | 4/1989 | Lambert et al. | 156/643 |
| 4,853,763 | 8/1989 | DeGree et al. | 357/81 |
| 4,902,857 | 2/1990 | Cranston et al. | 174/94 R |
| 4,961,064 | 10/1990 | Hara | 338/231 |
| 4,985,296 | 1/1991 | Mortimer, Jr. | 428/220 |
| 4,996,097 | 2/1991 | Fischer | 428/220 |
| 4,999,741 | 3/1991 | Tyler | 361/387 |
| 5,001,302 | 3/1991 | Atsumi | 174/94 R |
| 5,011,872 | 4/1991 | Latham et al. | 523/440 |
| 5,028,984 | 7/1991 | Ameen et al. | 357/72 |
| 5,045,249 | 9/1991 | Jin et al. | 264/24 |
| 5,060,114 | 10/1991 | Feinberg et al. | 361/387 |
| 5,084,211 | 1/1992 | Kawaguchi et al. | 252/511 |
| 5,137,283 | 8/1992 | Giarrusso et al. | 277/1 |
| 5,209,967 | 5/1993 | Wright et al. | 428/283 |
| 5,213,868 | 5/1993 | Liberty et al. | 428/131 |
| 5,227,230 | 7/1993 | McGlade | 428/319.1 |
| 5,431,571 | 7/1995 | Hanrahan et al. | 428/422 |

OTHER PUBLICATIONS

"Z–Axis Adhesive Film, Innovation in Electronic Interconnection," Bruce Grove, Interconnection Technology, Dec. 1992.

"Portable Electronics Packaging Project," Bert Haskell, Microelectronis and Computer Technology Corp. Sep. 1992 (Handout).

"Silicones with Improved Thermal Conductivity for Thermal Management in Electronic Packaging," Adam Peterson, Speciality Electronic Materials Development, pp. 613–619 (date unknown).

"Interconnection Method of Liquid Crystal Driver LSIs by Tab–on–Glass and Board to Glass Using Anisotropic Conductive Film and Monosotropic Heat Seal Connectors," Roger Reinke, (date unknown).

"Prediction and Measurment of Thermal Conductivity of Diamond Filled Adhesives," Justin C. Bolger, pp. 219–224.

"CHO–THERM® Thermal Interface Materials," Grace Electronic Materials, 1993.

"SIL–PAD® Design Guide," The Gerquist Company, Spring, 1993.

THERMALLY CONDUCTIVE ADHESIVE INTERFACE

RELATED APPLICATIONS

The present application is a continuation-in-part of U.S. patent application Ser. No. 08/296,220, filed Aug. 25, 1994 now abandoned, which is a continuation-in-part of U.S. patent application Ser. No. 08/196,048, filed Feb. 14, 1994.

BACKGROUND OF THE INVENTION

1. Field of the Invention

The present invention relates to electrical interfaces and particularly to thermally conductive adhesive interface 17 interfaces for use in a variety of electronic products.

2. Description of Related Art

Integrated circuit ("IC") chips have steadily become more powerful while being compacted into smaller and smaller packages. When compared to previous integrated circuit chips, this trend produces integrated chips which are significantly denser and which perform many more functions in a given period of time—resulting in an increase in the current they use. Consequently, smaller and faster chips tend to run significantly hotter than previous products.

As a result, heat management in electronic products has become a chief concern in product design. Reliability of electronic circuits tends to be tied to proper matches in the coefficients of expansion of various electronic components. As the temperature rises, mismatches in the coefficients of expansion cause stresses to develop between adjoining members. Under these circumstances, any increase in operating temperature will have a negative effect on reliability.

In an effort to control heat better, the use of various heat sinks is now a central focus in electronic equipment design. Examples of common heat sinks employed today include: IBM Thermal Conductive Modules (ITCM); Mitsubishi High Thermal Conduction Modules (HTCM); Hitachi SiC Heat Sink; Fujitsu FACOM VP2000 Cooling Mechanism; metal plates of copper, aluminum, etc.

In order to mate IC chips to heat sinks successfully, an interface which is elastic or otherwise conformable is preferred so as to ease installation and to minimize the effect of expansion and contraction between electronic components. Air gaps formed from inapt installation of a chip to a heat sink, and/or expansion and contraction cycles during operation, can greatly impede the flow of heat from the device. Conformability becomes especially important when the tolerances on the heat sink and chip tilt (in the case of flip chips) become large.

Typically, thermal greases or thermally conductive thermosetting materials are used to take up tolerances between electronic components. See, e.g., U.S. Pat. No. 5,028,984 to Ameen et al. While such materials may work well for some applications, they continue to have a number of drawbacks. These materials tend to be hard to control and are prone to contaminating components of the electronic device. For instance, care must be taken when using these materials to prevent unwanted contamination of solder joints and, in the case of electrically conductive thermoset resins, unwanted contamination of adjacent conductors. In practice, this usually results in a significant amount of wasted material. Additionally, clean up of such materials often requires the use of either unsafe or environmentally undesirable solvents.

In U.S. Pat. No. 5,137,283 to Giarusso et al. a gasket-type material is disclosed comprising a thin-film surrounding a meltable metal core. In operation, the gasket is installed as an interface and its temperature is increased to melt the metal core and allow it to conform to the component parts. Unfortunately, this construction is believed to be ineffective in avoiding air gaps that can form during normal thermal cycling of the device. Further, as is a common problem with solid gasket materials in general, it is believed that this device may experience limited compressibility, requiring either application of excessive pressure to the mating surfaces, or use of unacceptably thick sections of the gasket.

In U.S. Pat. No. 5,060,114 to Feinberg et al., conformability is sought by curing a metal or metal oxide filled silicone around the component to be cooled. Although this method may be successful, it is believed to be unduly complicated, costly, and time consuming for practical widespread use.

In addition, with most thermoset resins, and with gaskets employing thermally conductive particles as a filler, there are additional constraints in successful heat dissipation. In order to overcome thermal insulation between particles, it is often necessary to apply substantial pressure to the interface in order to urge the thermally conductive particles into direct contact with one another to produce the necessary amount of conduction through the material. This often requires unacceptable compressive force for integrated circuits to produce a viable thermally conductive interface.

As a result, most commercially available products can produce a conductivity in the range of only about 1.8 W/M °K (for greases) to 2.2 W/M °K (for epoxies). Even the most advanced (and expensive) materials, such as silver filled epoxies, can achieve a conductivity in the range of 3–4 W/M °K. Easily handled materials, such as self-adhesive materials available from Chomerics, Inc., Woburn, Mass., under the trademark CHO-THERM Thermal Interface Materials, and from The Bergquist Company, Minneapolis, Minn., under the trademark SIL-PAD Thermal Management Materials, can typically achieve a conductivity of only about 0.37–1.3 W/M °K and 0.6–1.5 W/M °K, respectively. Although these commercial materials can produce better conductivities at high mounting pressures, they deliver poor conductivity at very low mounting pressures (e.g., pressures below 2–3 lbs/in$^2$).

A number of other materials have been developed suitable for use in electrical circuit board construction centered around use of polytetrafluoroethylene (PTFE), and in many cases expanded PTFE as is taught in U.S. Pat. No. 3,953,566 to Gore. U.S. Pat. No. 4,985,296 to Mortimer teaches the use of a PTFE highly filled with inorganic filler that is between 0.1 and 5.0 mil thick and substantially pin hole free. This material is particularly suitable for use as an electrically or thermally conductive layer in printed circuit boards and the like. However, the process of producing this material requires densification of the membrane, significantly reducing its conformability. U.S. Pat. No. 4,996,097 to Fischer teaches similar technology useful for a thin capacitive layer in a printed wiring board (PWB). U.S. Pat. No. 4,518,737 to Traut teaches an extruded composite tape of ceramic filler and PTFE useful for its high dielectric constant. With each of these products the method for making is by bonding the PTFE in the composites at so-called "sintering" temperatures (i.e., at very high temperatures and/or pressures). These composites have not gained widespread use because of their difficult processing. This can be very inconvenient, and often impossible to accomplish, especially for many adhesive applications where materials being bonded cannot withstand the necessary temperatures and pressures.

Japanese laid-open patent application 61-40328 to S. Hamasaki, et al. teaches impregnating a silicone rubber imbibed within a porous expanded PTFE structure for use as a thin electrical insulator with thickness no greater than 50 µm. A solution of silicone rubber is imbibed into the porous structure of expanded PTFE, which renders the product transparent (free of filler). The final product is then cured. In an attempt to reinforce this structure, H. Kato, et al. teaches in Japanese laid-open patent 62-100539, a silicone rubber article which is made by first incorporating a ceramic into a dispersion of PTFE, thus collecting the filler at the nodes of the node-and-fibril structure, then imbibing the silicone resin into said fibrillated structure as described above. In both of these instances, the final product is a rubber-like cured sheet.

In a similar fashion, M. Hateyama, et al., in British patent 2,195,269B (EP-0248617B1), describes an article and process of imbibing expanded PTFE with a thermosetting resin which is useful as a substrate for a PWB. Unfortunately, previous attempts at this approach have been largely unsuccessful because high degrees of ceramic loading with the addition of ceramic filler tends to weaken the node and fibril structure.

Other problems experienced by many commercially available filled thermoset resins include: inadequate conformability (i.e., excessive compressive force required to get higher thermal conductivity); high flexural modulus after curing-resulting in substantial stress upon devices during thermal cycling; a lack of "compliance," resulting in stress fractures if the resin is flexed longitudinally after curing; long curing times; and difficulty in manufacturing in high volumes.

Another property which is sought but not yet available is a convenient and effective method of supplying an adhesive for use in circuit board construction. Presently available products attempting to provide these properties tend to be non-conformable, overly brittle, or difficult to process.

Accordingly, it is a primary purpose of the present invention to provide a thermally conductive interface which delivers relatively even heat dissipation and reduces the negative impact of flex and fatigue.

It is another purpose of the present invention to provide a thermally conductive interface that simultaneously provides adhesive for the fabrication of an integrated electronic package.

It is yet another purpose of the present invention to provide a thermally conductive interface which is conformable to provide a good fit between component parts without requiring undue compressive force to achieve the desired amount of thermal conductivity.

It is still another purpose of the present invention to provide a thermally conductive interface which is compliant, allowing the material to be more forgiving to longitudinal stresses.

It is a further purpose of the present invention to provide a film adhesive that is easy to use and contributes little or no contamination of adjacent areas. These and other purposes of the present invention will become evident from review of the following specification.

SUMMARY OF THE INVENTION

The present invention is an improved thermally conductive interface combining high thermal conductivity with substantial conformability.

To overcome deficiencies described in existing materials, the present invention adds adhesive to polytetrafluoroethylene (PTFE) resins such that the fillers are either imbedded into PTFE with the adhesive occupying the void space of the structure or suspended in the adhesive and thus are found in the void space of the node-and-fibril structure. Additionally, both these properties may be incorporated with a single material. This approach provides many advantages over existing bond plies and adhesive layer products.

The parent patent application demonstrates that a filled polytetrafluoroethylene with void spaces can provide superior thermal performance over conventional techniques, owing to its ability to conform to surface deviations in surfaces between which the interface is placed. Although this device provides superior results for its intended use, it is believed that thermal conductivities can be raised to much higher levels in anticipation of the electronic industries future requirements. The present invention accomplishes this goal by filling the void spaces of the PTFE structure with an adhesive material. The unfilled adhesives of the present invention alone all display rather poor thermal conductivities, yet the composite made by imbibing them into the conformable PTFE structure of the present invention displays markedly higher thermal conductivity than either adhesive or substrate alone. The effect is even more striking when the adhesive itself is also filled with a thermally conductive filler.

Additionally, by employing a compressible structure as a support material, such as expanded polytetrafluoroethylene (PTFE) or similar polymer, the interface of the present invention is provided with a significant degree of flexibility. This allows the interface to conform readily to provide a tight junction between component parts, reducing inefficiencies due to air gaps while providing a buffer between component parts during thermal cycling. The flexibility of the interface also provides far greater tolerances for longitudinal flexing and material fatigue during thermal cycling. An approximate estimate of the Young's moduli are:

| Material | Approx. Modulus (psi) |
| --- | --- |
| Dry filled membrane | <1000 |
| Membrane backfilled with oil | <500 |
| Membrane backfilled with adhesive | 15,000–33,000 |

DESCRIPTION OF THE DRAWINGS

The operation of the present invention should become apparent from the following description when considered in conjunction with the accompanying drawings, in which.

DETAILED DESCRIPTION OF THE INVENTION

The present invention comprises a thermally conductive interface for mounting between a variety of component parts to assist in the transference of heat energy.

Figure 1:
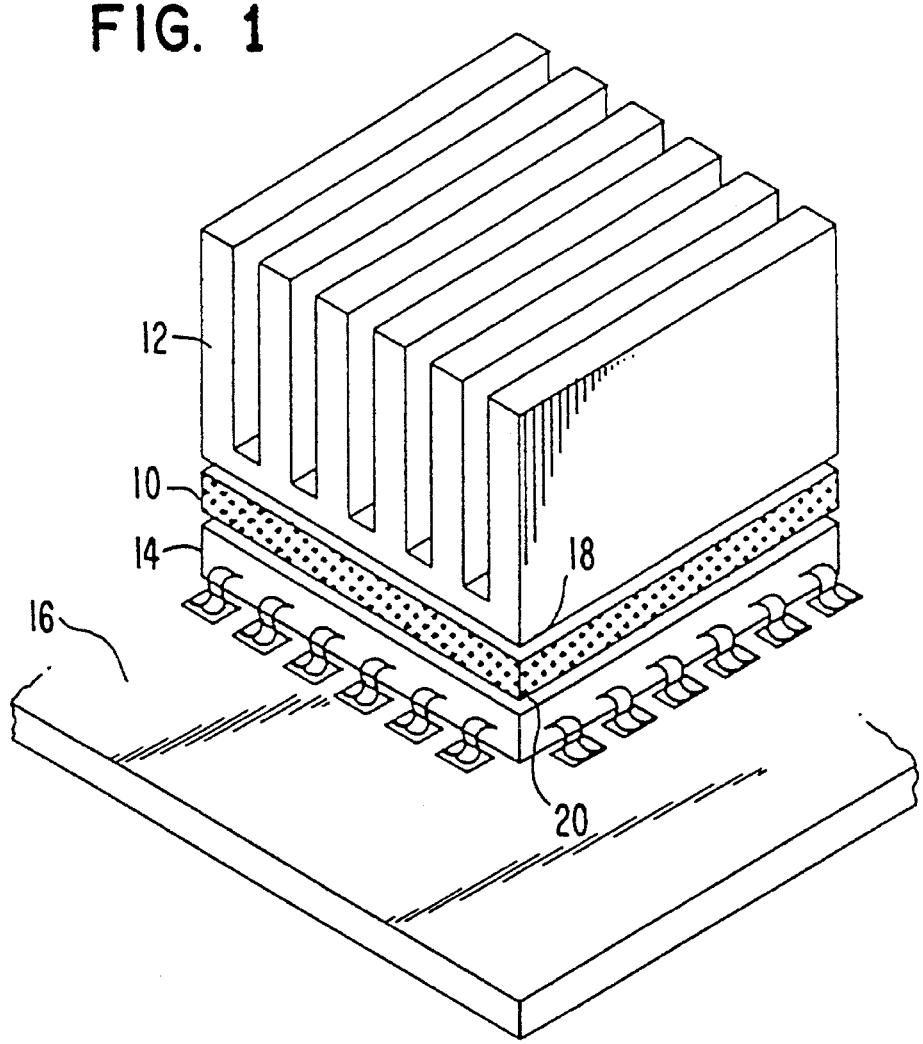
FIG. 1 is a three-quarter isometric view of one embodiment of a thermally conductive interface of the present invention shown mounted between component parts of an electronic device.

Shown in FIG. 1 is a thermally conductive, adhesive-loaded interface 10 of the present invention mounted between two representative components, a heat sink 12 and a integrated circuit 14, on an electronic circuit board 16. Unlike many presently available thermally conductive interfaces, the present invention provides exceptional conformability between component parts. As a result, with minimal compressive pressure, the interface 10 of the present invention forms a tight connection between the interface 10 and abutting surfaces 18, 20 of each of the components with little or no air spaces present to disrupt thermal conductivity.

As the term "tight" is used to describe the connection achieved between component parts using the interface of the present invention, it is meant to encompass a junction between component parts whereby the interface material has conformed to fill in irregularities in the surfaces of the component parts and the presence of adhesive, filled or unfilled, significantly reduces or eliminates any air spaces therebetween while simultaneously providing a bond between interfaces. The interface of the present invention is particularly effective at establishing a tight connection at relatively low mounting pressures. As the term "low mounting pressures" is used in this application, it is intended to encompass the restricted pressures that sensitive electronic products (e.g., silicon IC chips) can withstand, and includes pressure below about 30 lb/in$^2$ (147 kg/m$^2$).

Figure 2:
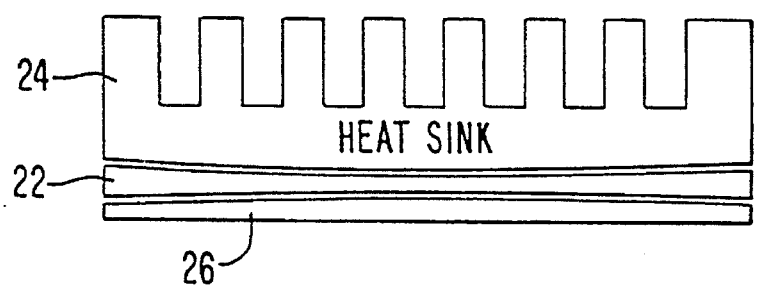
FIG. 2 is a cross-sectional view of another embodiment of a thermally conductive interface of the present invention shown mounted between two component parts of an electronic device.

The interface 10 of the present invention can be formed in a variety of shapes and sizes to fill particular needs. Shown in FIG. 2 is another embodiment of a thermally conductive interface 22 of the present invention. In this instance, the interface 22 is deformed to provide a compliant connection between a heat sink 24 and an electronic component 26.

The preferred construction of the interface of the present invention comprises a fluoropolymer material having fine thermally conductive particles embedded therein. The thermally conductive particles may be embedded within the interface with one of a variety of structures, such as having particles: a) imbedded into an expanded polytetrafluoroethylene (PTFE), with adhesive occupying the void space of the node-and-fibril structure; b) suspended in the adhesive and thus placed in the void space of the node-and-fibril structure; or c) both (a) and (b).

The thermally conductive particles used in the present invention preferably have the following properties: high thermal conductivity (e.g., in the range of 9.9 to 2000 W/M °K); particle size of <1 micron up to about 44 micron; and good packing characteristics. In order to achieve vastly improved packing characteristics, it is preferred that the particles comprise a number of different average sizes (e.g., being bi-modal or tri-modal distribution of sizes) so that unfilled air spaces between particles can be minimized.

Preferred particles for use with the present invention include: metals, such as silver coated copper, aluminum (Al), copper (Cu) or nickel (Ni), or zinc (Zn); metal oxides, such as zinc oxide, copper oxide, and aluminum oxide; or other thermally conductive, electrically non-conductive material, such as boron nitride (BN), aluminum nitride (AlN), diamond powder, and silicon carbide (SIC).

As is explained in more detail below, the thermally conductive particles provide primary heat transfer by being in direct contact with one another. The adhesive itself may be a thermoset or thermoplastic and can include polyglycidyl ether, polycyanurate, polyisocyanate, bis-triazine resins, poly (bis-maleimide), norbornene-terminated polyimide, acetylene-terminated polyimide, polybutadiene and functionalized copolymers thereof, polysiloxanes, poly sisqualoxane, functionalized polyphenylene ether, polyacrylate, novolak polymers and copolymers, fluoropolymers and copolymers, melamine polymers and copolymers, poly(bis phenycyclobutane) and blends thereof, and/or flame-retarded versions thereof and/or toughened versions thereof. Preferred adhesives for use with the present invention include: polyester, polybutadienes, polyepoxide, polyimide, polysiloxane, polycyanurate, polyurethane.

In one embodiment of the present invention, the particles are entrapped in the fluoropolymer support material itself without being completely coated by a thermally non-conductive material. The fluoropolymer material serves as a support to contain the thermally conductive particles and hold them in proper alignment between the component parts. Adhesive is imbibed within the pore volume of the support material, replacing all or part of the air. As such, ideally the fluoropolymer material has an open structure which is easily compressed to place the thermally conductive particles in direct contact with one another.

The porous fluoropolymer employed can be the usual fibrillated PTFE known in the art, or can be expanded porous PTFE as described in U.S. Pat. No. 3,953,566 to Gore. Preferably, the fluoropolymer material is expanded PTFE. The preferred material comprises a porous expanded PTFE which has been stretched at least 2 to 4 times its original size in accordance with U.S. Pat. No. 3,953,566. In addition, because of the nature of the expanded PTFE, stresses created due to mismatches in the thermal coefficients of expansion between component parts may be relieved in this conductive layer if it is placed between them.

It is known that the filled expanded PTFE membrane contains a significant number of micropores. Until the present invention, such micropores have been sought to contribute to the overall conformability of the material. The present invention intentionally backfills such micropores with a fluid material to improve the thermal properties of the material. Even with a fill of relatively poor thermally conductive material (e.g., epoxy, silicone, or other polymer (e.g., polyperfluoroether ether or polyphenyl ether)) drawn into the interior of the interface, the material's overall thermal conductivity is increased significantly. This process not only increases the thermal conductivity of the expanded PTFE material, but also dramatically strengthens and reinforces the adhesive material by reinforcing it with the strong expanded PTFE structure.

While the mechanism for improved thermal conductivity of the present invention is not yet fully understood, and without intending to limit it to applicants' present understanding of why the present invention successfully improves thermal performance, it is believed that two phenomena occur to provide the material of the present invention with its unique properties. First, as has been noted, the adhesive material serves to fill the voids in the expanded PTFE material, thus eliminating the thermally insulative properties of the air previously contained within the voids. Second, it is believed that the adhesive may also serve to modify the surface contact resistance of the material—providing a better interface with mated surfaces.

An example, of the improved properties of the present invention is illustrated in Table 1. Table 1 shows a series of membranes (expanded 2:1) filled with zinc oxide, each having a polybutadiene adhesive imbibed into it. The control substrate contained no adhesive within its void volume, and displayed a conductivity of 0.22 W/M°K. When about 2.4% of its total volume is displaced with adhesive, the conductivity increases significantly to 0.40 W/M°K. As is shown, the conductivity surprisingly increases directly with the amount of adhesive that is delivered even though the adhesive only displays a Tc of about 0.2 W/m°K.

to be removed or repositioned. When correct orientation is achieved, the bond is made permanent by curing the adhesive.

Another suitable composition for use in the present invention involves filling the PTFE with a metal powder, such as copper or nickel, having particle sizes in the 1 to 40 micron range. Bimodal and trimodal distributions can increase the loading of this material, such as providing particles in the 1 to 5 micron range mixed with particles in the 40 to 45 micron

TABLE 1

| Sample | Weight Fraction (W/W) | | | ρ (g/cc) | Volume Fraction (V/V) | | | | TC (W/m °K.) |
|---|---|---|---|---|---|---|---|---|---|
| | ZnO (%) | PTFE (%) | Adhesive (%) | | ZnO (%) | PTFE (%) | Adhesive (%) | Air (%) | |
| Control- Adhesive Only | 0.0 | 0.0 | 100.0 | 0.98 | 0.0 | 0.0 | 100.0 | 0.0 | 0.20 |
| Example No. 1 | 91.3 | 8.7 | 0.0 | 2.38 | 44.3 | 4.2 | 0.0 | 51.5 | 0.22 |
| Example No. 6 | 80.3 | 18.6 | 1.1 | 2.11 | 30.2 | 18.2 | 2.4 | 49.2 | 0.40 |
| Example No. 7 | 71.7 | 22.0 | 6.6 | 2.28 | 32.7 | 23.2 | 15.4 | 28.7 | 0.74 |

Similarly, a liquid containing a thermally conductive filler, such as zinc oxide, boron nitride, diamond, or metal powders, can be used to fill the void volume of the microporous substrate. For example, a zinc oxide filled silicone oil filled with zinc oxide particles having an average particle size of 0.35 microns, was used to fill a zinc oxide filled expanded PTFE film (expanded 4:1) having an average particle size of 2.4 microns. The conductivity of the filled PTFE is 0.078 W/M°K without the backfill and a conductivity of 1.384 W/M°K with it. This information is summarized in the following Table 2:

range. This allows greater packing density, with a subsequent increase in thermal conductivity without sacrificing conformability. The total volume percent (including air) of metal to finished filled PTFE is in the 20 to 90% range. The finished material may also be further plated with more metal such as tin/lead, copper, or nickel to further increase the material's thermal properties. The term "particle" is intended herein as being any small filler material of any shape, including round, flakes, fibers, etc.

Materials made from either of the above described methods may then be laminated together to create a good ther-

TABLE 2

| Sample | Weight Fraction (W/W) | | | ρ (g/cc) | Volume Fraction (V/V) | | | | TC (W/m °K.) |
|---|---|---|---|---|---|---|---|---|---|
| | ZnO (%) | PTFE (%) | Adhesive (%) | | ZnO (%) | PTFE (%) | Adhesive (%) | Air (%) | |
| Membrane Only | 91.3 | 8.7 | 0.0 | 2.38 | 44.3 | 4.2 | 0.0 | 51.5 | 0.22 |
| ZnO/ Silicone Oil Grease | 74.0 | 0.0 | 26.0 | 2.52 | 33.2 | 0.0 | 66.8 | 0.0 | 0.60 |
| Example No. 9 | 71.7 | 8.5 | 19.8 | 2.8 | 44.0 | 22.0 | 24.0 | 10.0 | 1.38 |

The backfilling with adhesive not only increases the conductivity, but also provides a mechanism to allow the interface to be attached to a heat sink in a method that readily lends itself to manufacture. Specifically, thermal greases are often messy and are precluded from use with heat sinks because the heat sink cannot be shipped with the grease on them. The backfilled membranes act as a scaffolding for the zinc oxide filled silicone oil (which can be considered a "grease") and is dry to the touch. However, when membrane is applied to a heat sink (or other flat plane, such as glass), and pressure is applied to it, oil is seen contacting the heat sink only under the membrane. In the case of adhesives, by using a curable, pressure sensitive adhesive, the interface can be attached to the heat sink and still allow the heat sink mally conductive material that is electrically insulating. By laminating one of these materials under pressure to a more thermally conductive material, such as, but not limited to, metals, (e.g., copper, aluminum), ceramics (e.g., silicon carbide), metal matrix composites, or high oriented carbon fibers in a metal matrix, a further improved material may be achieved. Another suitable method of lamination may comprise calendering wet tapes together, such as disclosed in U.S. Pat. Nos. 4,385,090 and 4,478,665 to Hubis.

To improve conductivities further, particulate filler may be mixed into a solvent solution or molten adhesive to afford a finely dispersed mixture. The filler in small particle form is ordinarily less than 40 microns in size, and preferably has an average particulate size between 1 and 10 microns. The mean pore size of the node-and-fibril structure should be large enough to allow for adequate penetration of the particulate. Generally, this amounts to a ratio of about 1:3 or greater (e.g., for a particulate of about 5 micron, the mean flow pore size of membrane should be at least 15 micron). If the substrate is to be an expanded PTFE substrate, then structures similar to those taught in U.S. Pat. No. 4,482,516 to Bowman et al., incorporated by reference, are desirable.

The open films are easily imbibed with ceramic-filled resin, with all or part of the air-filled void volume replaced with the ceramic filled resin. In the case where only part of the void volume of air is replaced with resin, the final composite can be compressed in place to a very thin, void-free composite with excellent adhesion, superior thickness control, and excellent flexibility and compressibility. Thus, in this manner, an exceptionally thin, well-controlled thickness of unusually highly loaded adhesives are produced, which were previously unattainable.

The composite of the present invention may be readily formed very thin, with a thickness of 0.1 to 0.38 mm or less. In fact, it is believed that the composite may be formed with a thickness as low as 0.025 mm.

The filler may be placed within the structure through a variety of means, including employing simple diffusion, injecting under pressure, drawing under a vacuum, driving in by means of ultrasonics, employing a solvent to facilitate transport, or spreading across the surface (such as with a doctor's blade). In addition, PTFE filled with pure metals may be electrolessly or electrolytically plated to add more metal to the finished product. This, of course, being done to thermally conductive interfaces that may be electrically conductive as well.

Also, where structural adhesives are not required, the adhesive may be applied in a pattern of distinct contact points (e.g., dots) so as to minimize the amount of adhesive on the membrane. Surprisingly, this can even be accomplished on an oiled impregnated membrane. An example of this approach is to use an adhesive, like Ricon R-156 with a zinc oxide filled membrane that gives a thermal resistance value of 2.08° C./W.

Another example of this approach is a series of small dots (about 20 mil diameter) of adhesive placed on the back of the membrane, preferably in a random pattern covering about 5–15% of the surface area of the membrane. This is sufficient to hold the membrane in place.

Finally, to achieve even greater conductivity, the filled materials may be laminated to other filled materials, e.g., metal filled PTFE to metal oxide filled PTFE, or to pure metals such as copper or aluminum, or to hybrid materials such as silicon carbide, metal matrix composites, or highly oriented carbon fiber.

It should be further understood by one skilled in the art that any combinations of these alternatives can be used to enhance conductivity. For example, a metal filled material may be plated, then laminated to a metal foil, and then filled with the adhesive.

Figure 3:
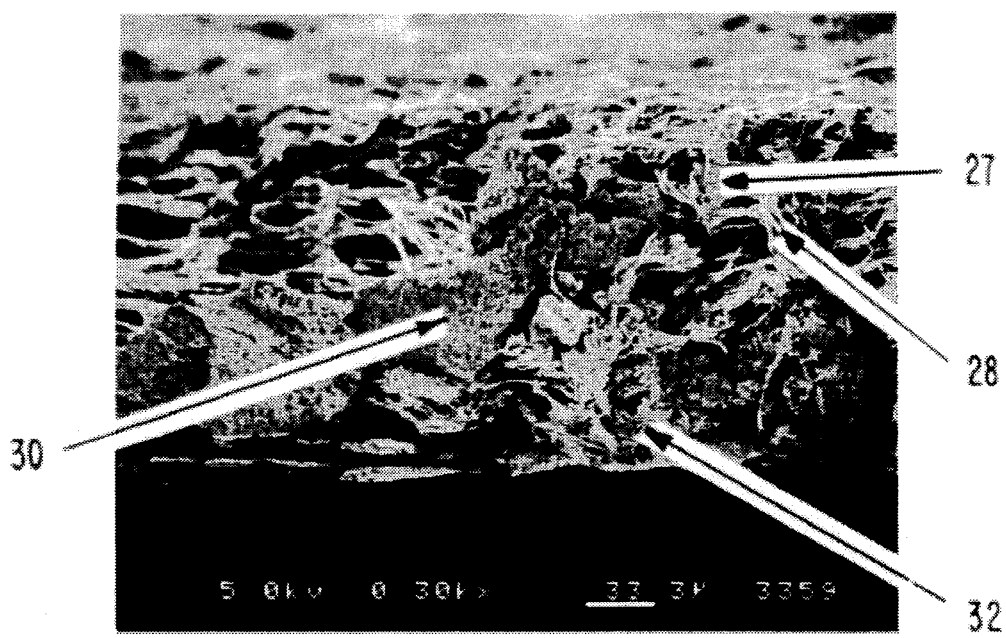
FIG. 3 is a scanning electron micrograph (SEM), enlarged 300 times, of a cross section of a thermally conductive adhesive interface of the present invention showing zinc oxide particles and epoxy adhesive imbibed therein.
Figure 4:
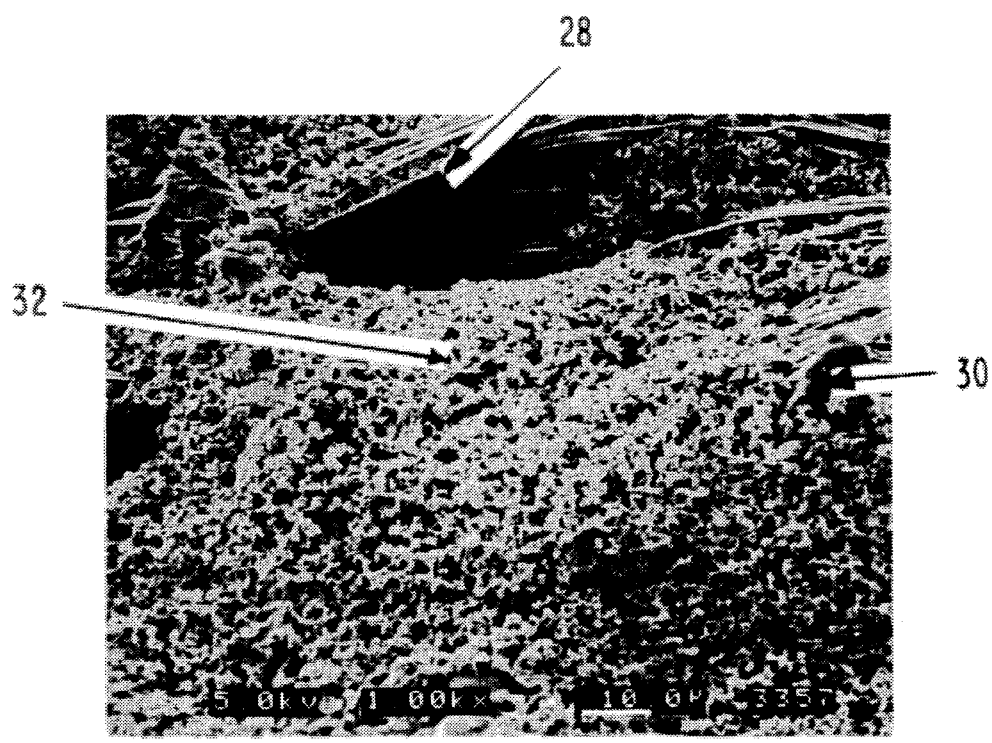
FIG. 4 is a SEM, enlarged 1000 times, of a surface of a thermally conductive adhesive interface of the present invention.

The construction of the interface of the present invention is best illustrated by the scanning electron micrographs (SEMs) of FIGS. 3 and 4. As is shown in the SEMs, an expanded PTFE fluoropolymer material 22 comprises a network of nodes 27 interconnected by fibrils 28. When formed in the manner described above, the thermally conductive particles 30, in this case zinc oxide, become enmeshed within polymer structure, including becoming directly attached or embedded in some of the nodes 27, and thus become secured within the fluoropolymer material. The imbibed adhesive 32, in this instance epoxy, can be seen as a granual structure throughout the expanded PTFE membrane.

Figure 5:
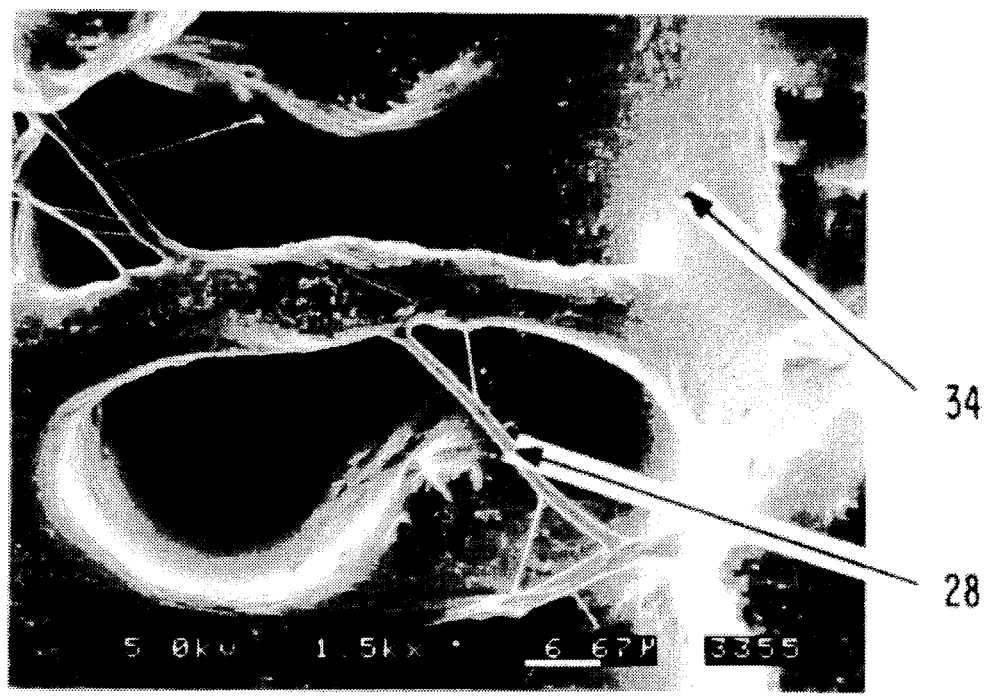
FIG. 5 is an SEM enlarged 1,500 times of a thermally conductive interface of the present invention having grease material imbibed therein.

FIG. 5 shows how grease 34, in this case particle-filled grease material, thoroughly coats the entire internal structure of the membrane. Thermally insulative open void spaced are greatly reduced in this process.

The present invention demonstrates improvements over commercial products presently available. The interfaces produced in accordance with the present invention are the only interfaces which combine all of the following properties: a thermal conductivity of >0.5 W/M °K and up to and above 7 W/M °K; substantial compliance; substantial conformability; porosity to provide stress relief; and ease in application. The combination of these characteristics provide a thermal path that is believed to have the lowest thermal impedance possible.

Without intending to limit the scope of the present invention, the process of making and using the present invention may be better understood by reference to the following examples:

EXAMPLE 1

A slurry of 2240 g of zinc oxide grade Z-52 obtained from Fisher Scientific Company of Pittsburgh, Pa., and 23,800 ml of deionized water was prepared in a 30 liter container. While the slurry was agitated at 300 rpm, 560 g of PTFE in the form of 29.4% solids PTFE dispersion was rapidly poured into the mixing vessel. The PTFE dispersion was an aqueous dispersion obtained from E. I. dupont de Nemours Company, Wilmington, Del. The mixture was self-coagulating and within 1 minute the coagulum had settled to the bottom of the mixing vessel and the water was clear.

The coagulum was dried at 165° C. in a convection oven. The material dried in small, cracked cakes approximately 2 cm thick and was chilled to below 0° C. The chilled cake was hand ground using a tight, circular motion and minimal downward force through a 0.635 cm mesh stainless steel screen, then 0.267 g of mineral spirits per gram of powder was added. The mixture was chilled, again passed through a 0.635 cm mesh screen, tumbled for 10 minutes, then allowed to sit at 18° C. for 48 hours and was retumbled for 10 minutes.

A pellet was formed in a cylinder by pulling a vacuum and pressing at 800 psi. The pellet was then heated in a sealed tube. The pellet was then extruded into tape form.

The tape was then calendered through heated rolls. The lubricant was then evaporated by running the tape across heated rolls. Tape thickness was about 11.7 mils after drying.

EXAMPLE 2

The tape produced in Example 1 was then filled using a silicone oil to fill all air spaces therein. Approximately 1 g of a Dow Corning DC 200 silicone oil (30 kcs) was applied to both sides of the tape using a doctor blade until the silicone oil coated the interface and filled most of the voids therein. The interface comprised a thickness of about 11.5 mils after this procedure. This comprised a weight gain of 22% of the original weight of the tape.

EXAMPLE 3

A slurry of 4376 g of boron nitride grade HCP obtained from Advanced Ceramics Company of Cleveland, Ohio, and 55,000 ml of deionized water was prepared in a 30 liter container. While the slurry was agitated at 300 rpm, 4,324 g of PTFE in the form of 15.7% solids PTFE dispersion was rapidly poured into the mixing vessel. The PTFE dispersion was an aqueous dispersion obtained from ICI Americas, Inc., Bayonne, N.J. The mixture was self-coagulating and within 1 minute the coagulum had settled to the bottom of the mixing vessel and the water was clear.

The coagulum was dried at 165° C. in a convection oven. The material dried in small, cracked cakes approximately 2 cm thick and was chilled to below 0° C. The chilled cake was hand ground using a tight, circular motion and minimal downward force through a 0.635 cm mesh stainless steel screen, the 0.267 g of mineral spirits per gram of powder was added. The mixture was chilled, again passed through a 0.635 cm mesh screen, tumbled for 10 minutes, then allowed to sit at 18° C. for 48 hours and was retumbled for 10 minutes.

A pellet was formed in a cylinder by pulling a vacuum and pressing at 800 psi. The pellet was then heated in a sealed tube. The pellet was then extruded into tape form.

The tape was then calendered through heated rolls. The lubricant was then evaporated by running the tape across heated rolls. Tape thickness was 10.5 mils after drying.

EXAMPLE 4

The tape of Example 3 was stretched in accordance with U.S. Pat. No. 3,953,566 to Gore, incorporated by reference, under the following expansion conditions: ratio of 2:1 across metal rolls heated to 270° C. with an input speed of 52.5 ft/min and an output speed 105 ft/min.

EXAMPLE 5

A slurry of 301.7 g of −325 mesh copper powder and 5.1 g of <7 micron copper powder and 920 g of deionized water was prepared in a 2 liter baffled stainless steel container. Copper powder was purchased from SCM Metal Products Inc. of Research Triangle Park, N.C. After 1 minute of mixing, 18.2 g of PTFE solids in the form of 25.0% dispersion was rapidly poured into the mixing vessel. The dispersion was obtained from E. I. dupont de Nemours and Company, Wilmington, Del. After 10 seconds, 38.3 g of SEDIPUR 803 modified cationic surfactant was poured into the mixture. The mixture coagulated rapidly. After stopping, the mixing process, the coagulum settled to the bottom and the effluent was clear.

The coagulum was dried at 165° C. in a convection oven. The material dried in small, cracked cakes and was chilled to below 0° C. The chilled cake was hand ground using a tight, circular motion and minimal downward force through a 0.635 cm mesh stainless steel screen, then 75 cc of a mixture of 2 parts propylene glycol (PPG) and 1 part isopropanol (IPA) per pound of mix was added. The mixture was chilled, again passed through a 0.635 cm mesh screen, tumbled for 10 minutes, then allowed to sit at 18° C. for 48 hours and was retumbled for 10 minutes.

A pellet was formed in a cylinder by pulling a vacuum and pressing at 250 psi. The pellet was then heated in a sealed tube. The pellet was then extruded into tape form.

The tape was then calendered through heated rolls. The lubricant was then evaporated by running the tape across steam heated plates at 250° C. Tape thickness was about 13 mils after drying.

Measuring Procedure

Samples are cut to 2.25 inch squares. The test device consists of two copper blocks. The top block is heated and insulated. The bottom block is cooled by circulating water. The test device sits inside a frame that allows constant pressure to be applied to the test device. The test device was designed similarly to the device described in ASTM 5470-93, Standard Test Method for Thermal Transmission Properties of Thin Thermally Conductive Solid Electrical Insulation Materials. The hot block is heated with a given amount of power. The temperature drop down the hot block is monitored in two places with four thermocouples. The temperature at the hot surface is approximated by thermocouples that are mounted 0.031 inches away from the surface. The temperature at the test specimen surface is the average of the four thermocouple readings. The cold block is identical in design and thermocouple placement. Prior to mounting the specimen, the thickness is measured. The specimen is mounted on the bottom cold block. The top hot block is placed over the specimen. A given pressure is applied. The test consists of measuring the temperature drop across the test specimen as a function of the power supplied. Thermal resistance is calculated by dividing the temperature difference across the sample by the power supplied. The units are °C./W. Thermal conductivity is calculated by using Fourier's conduction equation:

$$k = \frac{Q \times t}{A \times \Delta T}$$

where k=thermal conductivity, W/m°C.

Q=power, W t=sample thickness, m

A=sample area, m$^2$

ΔT=temperature drop across sample, °C.

Temperature readings are taken every one half hour until equilibrium is reached.

| Sample | Condition | Thickness (mils) | k @ 10 psi (W/M K.) | k @ 25 psi (W/M K.) |
|---|---|---|---|---|
| Example 1 | Dry/unexp. | 10.7 | 0.513 | 0.496 |
| Example 2 | Oil/unexp. | 10.7 | 0.810 | 0.904 |
| Example 3 | Dry/unexp. | 9.3 | 0.393 | 0.378 |
| Example 4 | Dry/2:1 exp | 8.8 | 0.293 | 0.294 |
| Example 5 | Dry/unexp. | 10.5 | 0.565 | 0.578 |
| Berquist PPK10AC | — | 8.6 | 0.43 | — |
| Chomerics T405 | — | 5.0 | 0.46 | — |

"Compliancy" is defined as the ability of an interface to fill a gap between two surfaces that are not planar. This can be tested by tilting one surface at a slight angle to its mating surface, such as through insertion of a shim of one third to one half the thickness of the interface between the interface and the two mating surfaces. Thermal conductivity is measured using this set-up and compared to the thermal conductivity of the interface without the shim. A drop of less than 50% of the original conductivity was deemed to be compliant. Preferably, the interface is sufficiently compliant to accommodate a 2 mil differential over the length of a 2 inch interface.

"Conformability" is defined as the ability of the interface to fill an uneven protrusion or texturing on a surface. The interface is tested to determine if it can conform to a micro rough surface or a surface that has a protrusion on one surface. An interface is deemed conformable if the thermal conductivity does not decrease by more than 50%.

The following table displays test results with references to competitive products.

| | | Tilt Data | | |
|---|---|---|---|---|
| Interface | Thick in | Thermal Conductivity (3 W/m K.) No Protusion | Percent Change Decrease 1.0 mil protrusion | Percent Change Decrease 2.5 mil protrusion |
| Zinc Oxide PTFE* | 0.0075 | 0.5 | 3.8 | 48 |
| Chromerics T412 | 0.009 | 1.6 | 70 | 150 |

| | | Center Protrusion Data | | |
|---|---|---|---|---|
| Interface | Thick in | Thermal Conductivity (3 W/m K.) No Protusion | Percent Change Decrease 1.0 mil protrusion | Percent Change Decrease 2.5 mil protrusion |
| Zinc Oxide PTFE* | 0.0075 | 0.5 | 4.0 | 34 |
| Chromerics T412 | 0.009 | 1.6 | 55 | 71 |

*Made in accordance to Example 1 with additional processing steps after drying the material was expanded with the following conditions: ratio of 4:1 across metal rolls heated to 270° C. with an input speed of 26.25 ft/min and an output speed of 105 fpm. The interface was then backfilled with a perfluoroether oil.

The thermally conductive interface of the present invention is particularly designed for the dissipation of heat energy from component parts of electronic devices, such as power FET, computer logic circuits, and other high electronic density circuits. It should be understood, however, that applications of the present invention may include a wide selection of other uses, such as: power transformers, transistor packages (such as those designated TO-3, TO-5, TO-18, TO-36, TO-66, TO-220, etc.) and diode packages (such as those designated DO-4, DO-5, etc.).

It should be likewise understood that without departing from the present invention the thermally conductive properties of the present invention may also be employed in the transference of heat to certain component parts, such as heat sinks, cold plates, and the like.

Further testing of conformability using (1) standard flat test heads, (2) curved test heads, and (3) microrough test heads established that the material of the present invention provided good conformability and relatively consistent surface conductivity despite variations in test head profiles. By contrast, employing the same test heads with competitive materials from Bergquist and Chomeric demonstrated significantly poorer conductivity performance with curved and microrough test head profiles.

The backfilling of the above-described materials is set forth in the following Examples 6 through 10.

EXAMPLE 6

A swatch of expanded ZnO-filled PTFE substrate produced in accordance with Example 1 was dipped into a 12.5% (w/w) bath of polybutadiene adhesive R-104 (obtained from Ricon Resins, Broomfield, Colo.) for about 0.25 minute. Upon removing the swatch, the excess resin was wiped off the surface of both sides. The web was dried at 120° C. for 1 min. under tension to afford a flexible composite. The B-staged prepreg thus produced comprises of 1.1% by weight adhesive, 80.3% ZnO, and 18.6% PTFE. Several plies of this prepreg were laid up between release sheet and pressed at 100 psi in a hydraulic press at temperature of 150° C. for 30 minutes then cooled. The composite layer had a density of 2.1 g/cm$^3$. The adhesion to aluminum was 8.8 psi peel strength.

EXAMPLE 7

A swatch of expanded ZnO-filled PTFE substrate produced in accordance with Example 1 was dipped into a 20% (w/w) bath of polybutadiene adhesive R-104 (obtained from Ricon Resins, Broomfield, Colo.) for about 0.25 minute. Upon removing the swatch, the excess resin was wiped off the surface of both sides. The web was dried at 120° C. for 1 min. under tension to afford a flexible composite. The B-staged prepreg thus produced comprises the figures set forth in Table 1, above. Several plies of this prepreg were laid up between release sheet and pressed at 100 psi in a hydraulic press at temperature of 150° C. for 30 minutes then cooled. The composite had a density of 2.1 g/cm$^3$. The adhesion to aluminum was 8.8 psi peel strength.

EXAMPLE 8

A fine dispersion was prepared by mixing 218 g ZnO (Fisher Scientific Catalog No. Z52), 151 g of a flame-retarded dicyanamide/2 methylimidazole catalyzed bisphenol A based polyglycidyl ether (Nelco N-4002-5, Nelco Corp.). The dispersion was constantly agitated so as to insure uniformity. A swatch of 0.002" thick expanded PTFE was then dipped into the resin mixture. This membrane had a mean flow presize of greater than 20 μm. Upon removing the swatch, the excess resin was wiped off the surface of both sides. The web was air-dried at 120° C. for 1 minute under tension to afford a flexible composite. The B-staged prepreg thus produced displayed a thermal conductivity of 0.494 W/m°K.

EXAMPLE 9

A fine dispersion was prepared by mixing 25.2 g ZnO (Fisher Scientific Catalog No. Z52), 75.2 g silicone oil (Dow Corning #200 10kcs) and 177 g CH$_2$Cl$_2$. The dispersion was constantly agitated so as to insure uniformity. A swatch of 0.002" thick filled expanded PTFE of Example 1 was then dipped into the resin mixture. Upon removing the swatch, the excess resin was wiped off the surface of both sides. The web was air-dried for 18 hours. The composite thus produced displayed a thermal conductivity of 1.384 W/m°K.

EXAMPLE 10

A fine dispersion was prepared by mixing 44 g Ni (Aldrich #26,698-1, average particle size 3 μm) into 17.4 g of a thermosetting silicone (Dow 1-4105, Dow Corning Co.). The dispersion was constantly agitated so as to insure uniformity. A swatch of 0.002" thick expanded PTFE was then dipped into the resin mixture. This membrane had a mean flow presize of greater than 20 μm. Upon removing the swatch, the excess resin paste was wiped off the surface of both sides. The web was dried at 165° C. for 1 minute under tension to afford a flexible composite. The B-staged prepreg thus produced comprised of 46 weight percent Ni, 21 weight percent PTFE, and 32 weight percent silicone. This resulted in a material having electrical conductivity less than 100 milliohms through plane, and a thermal impedance of 0.27 C/W average ply thickness of 0.002" (2 mil) dielectric laminate thickness.

Measuring Procedures

The materials of Examples 6 through 10 were tested in the following manner.

Mean Flow Pore Size was determined using the Coulter® Porometer II (Coulter Electronics, Ltd., Luton UK) which reports the value directly.

Average particle size and largest particle size were determined using a Microtrac light scattering particle size analyzer Model No. FRA (Microtrac Division of Leeds & Northrup, North Wales, Pa., USA). The average particle size (APS) is defined as the value at which 50% of the particles are larger than. The largest particle size (LPS) is defined as the largest detectable particle on a Microtrac histogram.

Observed Density ($\rho$obs) was calculated by dividing the observed weight in grams by the calculated volume in cubic centimeters (cc). The volume of the sample was calculated by multiplying the average thickness, length and width. Each average comprised of at least 5 separate measurements. The uncertainty associated with these measurements was carried throughout the calculations.

Calculated Density ($\rho$calc) was calculated by the following equation: $\rho\ \text{calc} = \Sigma(vi)*(\rho i)$; where $vi$ is the volume fraction of the $i^{th}$ component, and $\rho i$ is the density of the $i^{th}$ component.

Peel values were determined using a 90° peel configuration on an aluminum-clad laminate anchored to a rigid sliding plane substrate coupled to an Applied Test Systems Model No. 1401 computer-controlled tensile testing machine (Applied Test Systems, Inc., Butler, Pa., USA).

Compositions by weight for Examples 1 through 9 were determined by thermalgravimetric analysis (TGA) using a TA High Resolution Thermalgravimetric Analyzer Model No. 2950 linked to a TA Thermal Analyst CPU Model No. 2000. (TA Instruments, Wilmington, Del., USA). Each composite displayed stepwise decomposition, each step being attributable to a separate component. The uncertainty associated with this measurement was carried through any calculation. For Example 10, weight fraction of each component was determined by first determining the resin content directly by extraction. Separately, compositional make-up of the substrate was independently checked both by the relative weight percentages of the components actually mixed, and by thermalgravimetric analysis. The relative composition of each component was then calculated from the following equation: % ith component =(1-Resin Content) * (% ith component in substrate).

Void volume (VV) or "volume percent air" was calculated by dividing the observed density by the calculated density and subtracting from unity, while propagating the appropriate degree of uncertainty.

Volume fraction (VF) of each component was calculated multiplying the volume of massing the composite (1-VV) by the volume fraction of each respective component. It is calculated by the following equation: $VF_i=(1-VV)*$(Volume of $i^{th}$ component/Total volume of composite)=$[(\rho obs)/(\rho calc)]*[((W_i)*(\rho i)](VV=\Sigma_i(W_i)(\rho i)]$; where $VF_i$ is the volume fraction of the $i^{th}$ component, $\rho$obs is the observed density in g/cc, $\rho$calc is the calculated density in g/cc, $w_i$ is the weight fraction of the $i^{th}$ component and $\rho i$ is the density of the ith component in g/cc.

While particular embodiments of the present invention have been illustrated and described herein, the present invention should not be limited to such illustrations and descriptions. It should be apparent that changes and modifications may be incorporated and embodied as part of the present invention within the scope of the following claims.

The invention claimed is:

1. A thermally conductive interface mounted between electronic component parts which comprises:

a porous fluoropolymer material having a first surface and a second surface;

thermally conductive particles embedded within the fluoropolymer material between the first and second surfaces; and an adhesive material imbibed within the porous fluoropolymer material;

wherein the interface conforms to provide a tight thermally conductive interface between the component parts; and wherein the interface is sufficiently conformable to form a tight thermally conductive interface under a pressure of less than about 147 kg/m$^2$ (30 psi).

2. The thermally conductive interface of claim 1 wherein when the interface is mounted between component parts, the thermally conductive particles are in direct contact with each of the component parts.

3. The thermally conductive interface of claim 1 wherein the fluoropolymer material comprises a network of nodes interconnected by fibrils, and at least some of the thermally conductive particles are attached to the nodes.

4. The thermally conductive interface of claim 3 wherein the adhesive material is filled within voids between the network of nodes and fibrils.

5. The thermally conductive interface of claim 3 wherein the fluoropolymer material comprises an expanded polytetrafluoroethylene (PTFE).

6. The thermally conductive interface of claim 1 wherein the interface includes particles of different sizes mixed therein so as to accommodate greater packing density.

7. The thermally conductive interface of claim 1 wherein the interface is about 0.1 to 0.38 mm thick and has a high heat dissipation rate.

8. The thermally conductive interface of claim 1 wherein the thermally conductive particles are suspended in the adhesive.

9. The thermally conductive interface of claim 1 wherein the interface is sufficiently compliant to accommodate at least a 0.127 mm (5 mil) differential between one end and another of an interface measuring about 127 mm in length.

10. The thermally conductive interface of claim 1 wherein the adhesive is selected from the group consisting of polyester, polybutadienes, polyepoxide, polyimide, polysiloxane, polycyanurate, polyurethane, polysisquloxane, poly bis cyclobutane.

11. The thermally conductive interface of claim 9 wherein the interface provides relief of stresses generated due to differences in coefficients of expansion between component parts.

12. The thermally conductive interface of claim 1 wherein the interface is sufficiently compliant to fill a gap between two surfaces that are not parallel.

13. The thermally conductive interface of claim 1 wherein thermally conductive particles are substantially free of a thermally insulative coating.

14. The thermally conductive interface of claim 13 wherein the fluoropolymer material includes a network of nodes interconnected by fibrils, and at least some of the thermally conductive particles are attached to the nodes.

15. The thermally conductive interface of claim 1 wherein the thermally conductive particles are selected from the group consisting of zinc oxide, boron nitride, aluminum nitride, aluminum oxide, copper, nickel, and silicon carbide.

16. A thermally conductive interface mounted between component parts comprising:

a porous fluoropolymer material including a network of nodes interconnected by fibrils;

thermally conductive particles contained within the fluoropolymer material, at least some of the particles being embedded within the nodes of the fluoropolymer; and adhesive material imbibed within the porous fluoropolymer materials;

wherein the interface conforms to provide a tight thermally conductive interface between the component parts, placing thermally conductive particles in direct contact with each of the component parts; and wherein the interface is sufficiently compressible so as to provide a tight seal between the component parts at relatively low mounting pressures of less than 147 g/m$^2$ (30 psi).

17. The thermally conductive interface of claim 16 wherein the interface includes particles of different sizes mixed therein so as to accommodate greater packing density.

18. The thermally conductive interface of claim 16 wherein the adhesive material is selected from the group consisting of polyester, polybutadienes, polyepoxide, polyimide, polysiloxane, polycyanurate, polyurethane, polysisquloxane, poly bis cyclobutane.

* * * * *